(12) United States Patent
Shapira et al.

(10) Patent No.: US 10,700,718 B2
(45) Date of Patent: Jun. 30, 2020

(54) FREQUENCY DETECTION FOR OVER-THE-AIR CALIBRATION OF OSCILLATORS

(71) Applicant: Wiliot, Ltd., Caesarea (IL)

(72) Inventors: Nir Shapira, Ra'anana (IL); Shay Koren, Tel-Aviv (IL)

(73) Assignee: WILIOT, LTD., Caesarea (IL)

( * ) Notice: Subject to any disclaimer, the term of this patent is extended or adjusted under 35 U.S.C. 154(b) by 0 days.

(21) Appl. No.: 16/515,609

(22) Filed: Jul. 18, 2019

(65) Prior Publication Data

US 2020/0028530 A1 Jan. 23, 2020

Related U.S. Application Data

(60) Provisional application No. 62/700,589, filed on Jul. 19, 2018.

(51) Int. Cl.
*H04B 1/40* (2015.01)
*H04B 1/04* (2006.01)
*H03L 7/099* (2006.01)

(52) U.S. Cl.
CPC .............. *H04B 1/04* (2013.01); *H03L 7/099* (2013.01)

(58) Field of Classification Search
CPC ...... H04B 1/04; H04B 1/0475; H04B 1/0483; H04B 17/12; H04W 72/005; H04W 4/06; H04W 4/80; H04W 4/023; H03L 7/097; H03L 7/099
See application file for complete search history.

(56) References Cited

U.S. PATENT DOCUMENTS

| 6,380,835 | B1 | 4/2002 | Lee |
| 6,670,852 | B1 | 12/2003 | Hauck |
| 6,922,128 | B2 | 7/2005 | Vilander et al. |
| 7,800,457 | B2 | 9/2010 | Unkrich et al. |
| 7,898,343 | B1 | 3/2011 | Janesch |
| 2003/0078013 | A1 | 4/2003 | Ferguson |
| 2005/0007204 | A1* | 1/2005 | Howe .................. H03B 5/1817 331/107 DP |

(Continued)

FOREIGN PATENT DOCUMENTS

| CA | 2018264 C | 3/1996 |
| EP | 2978133 A1 | 1/2016 |

OTHER PUBLICATIONS

Jae-Seung, et al., "Energy-Efficient RF Systems / 13.1", 2015 IEEE International Solid-State Circuits Conference, Session 13, pp. 234-236.

(Continued)

*Primary Examiner* — Thanh C Le
(74) *Attorney, Agent, or Firm* — M&B IP Analysts, LLC

(57) ABSTRACT

An oscillator calibration circuit is provided. The oscillator calibration circuit includes a signal frequency detector for producing a reference signal from a received over-the-air signal detecting a frequency of the over-the-air signal; and a first frequency locking circuit (FLC) coupled to the signal frequency detector and to a first oscillator, wherein the first FLC calibrates the frequency of the first oscillator using the reference signal to a radio frequency (RF) carrier frequency, wherein the reference signal is utilized for calibrating the first oscillator based on the frequency of the detected over-the-air signal.

20 Claims, 9 Drawing Sheets

(56) References Cited

U.S. PATENT DOCUMENTS

| | | | |
|---|---|---|---|
| 2006/0049982 A1* | 3/2006 | Wells | G01S 19/256 |
| | | | 342/357.29 |
| 2007/0205871 A1 | 9/2007 | Posamentier | |
| 2009/0140383 A1 | 6/2009 | Chang et al. | |
| 2014/0191815 A1 | 7/2014 | Mirzaei et al. | |
| 2017/0265164 A1 | 9/2017 | Wiser | |
| 2019/0227144 A1* | 7/2019 | Lin | H04B 17/21 |

OTHER PUBLICATIONS

Masuch, et al., "A 1.1-mW-RX-81.4-dBm Sensitivity CMOS Transceiver for Bluetooth Low Energy", IEEE Transactions on Microwave Theory and Techniques, vol. 61., No. 4, Apr. 2013, pp. 1660-1673.

International Search Report and Written Opinion of International Searching Authority for PCT/US2019/023176, ISA/RU, Moscow, Russia, dated Aug. 6, 2019.

* cited by examiner

FREQUENCY DETECTION FOR OVER-THE-AIR CALIBRATION OF OSCILLATORS

CROSS REFERENCE TO RELATED APPLICATIONS

This application claims the benefit of U.S. provisional application No. 62/700,589 filed on Jul. 19, 2018. This application is herein incorporated by reference.

TECHNICAL FIELD

The present disclosure generally relates to calibrating oscillators of low-power transmitters operable of Internet of things (IoT) devices.

BACKGROUND

The Internet of things (IoT) is the inter-networking of physical devices, vehicles, buildings, and other items embedded with electronics, software, sensors, actuators, and network connectivity that enable these objects to collect and exchange data. IoT is expected to offer advanced connectivity of devices, systems, and services that goes beyond machine-to-machine (M2M) communications and covers a variety of protocols, domains, and applications.

IoT can be encapsulated in a wide variety of devices, such as heart monitoring implants, biochip transponders on farm animals, automobiles with built-in sensors, automation of lighting, heating, ventilation, air conditioning (HVAC) systems, and appliances such as washer/dryers, robotic vacuums, air purifiers, ovens or refrigerators/freezers that use Wi-Fi for remote monitoring. Typically, IoT devices encapsulate wireless sensors or a network of such sensors.

Most IoT devices are wireless devices that collect data and transmit such data to a central controller. There are a few requirements to be met to allow widespread deployment of IoT devices. Such requirements include reliable communication links, low energy consumption, and low maintenance costs.

To this aim, an IoT device and a connected wireless sensor are designed to support low power communication protocols, such as Bluetooth low energy (BLE), LoRa, and the like. However, IoT devices utilizing such protocols require a battery for power, such as a coin battery. The reliance on a battery power source is a limiting factor for electronic devices, due to, among other elements: cost, size, lack of durability to environmental effects, and the requirement for frequent replacement. As an alternative to using batteries, power may be harvested from environmental sources such as light, movement, and radio frequency transmissions. In order to minimize the power consumption, IoT devices are designed with the minimum required components for implementing low-power consumption oscillators.

FIG. 1 schematically illustrates a standard BLE transmitter 100 including a BLE packetizer 110, an oscillator 120, a power source 130, an amplifier 140, and an antenna 150. These components allow for the transmission of wireless signals from the BLE transmitter 100.

The BLE standard defines 40 communication channels from 2.4000 GHz to 2.4835 GHz within the industrial, scientific and medical (ISM) bands. Out of the 40 Bluetooth channels, 37 channels are used for communicating data and the last three channels (channel numbers: 37, 38, and 39) are used as advertising channels to set up connections and send broadcast data. The BLE standard defines a frequency hopping spread spectrum technique in which a radio hops between channels on each connection event. A broadcaster device may advertise on any one of the 3 advertisement channels. The modulation scheme defined for the BLE standard is a Gaussian frequency shift keying (GFSK) modulation. To this end, within each channel, a frequency deviation greater than 185 KHz above the carrier frequency corresponds to a bit with a binary value '1', and a frequency deviation less than 185 KHz corresponds to a bit with a binary value '0'.

The BLE packetizer 110 may receive a signal originated from a processor of a host device. Such a signal may include data or control parameters included in the signal transmitted by the BLE transmitter 100.

The oscillator 120 generates a radio frequency (RF) carrier signal that may carry the data signal generated by the BLE packetizer 110. The modulated RF signal, carrying the data signal, is amplified by the amplifier 140 and then broadcast by the antenna 150. The power source 130 may be a battery.

The oscillator 120 may be a free-running oscillator, which may be used to directly generate an RF carrier signal. Thus, a free-running oscillator may replace a frequency synthesizer to generate an RF carrier signal. Utilization of a free-running oscillator may result in power savings. In the BLE transmitter 100, the free-running oscillator generates an RF carrier signal having a frequency within a specific portion of the wireless spectrum, e.g., the 2.4 GHz wireless spectrum.

Typically, the free running oscillator is locked via a phase-locked loop (PLL) to a clock, originating from a crystal oscillator. The crystal oscillator has a resonator 121 that may be also included on a board hosting the processor of an IoT device. The resonator 121 is typically a crystal resonator, e.g., a quartz resonator, or a microelectromechanical systems (MEMS) based resonator which typically provides a sufficiently accurate and stable time/frequency reference. However, for low-cost, low-powered, and small form-factored IoT devices, it is desirable to omit such a resonator.

Some devices, such as radio frequency identification (RFID) devices, use an external signal as a reference signal. Typically, an RFID reader demodulates a received signal onto the carrier wave transmitted to RFID tags. An RFID tag receiving the carrier wave reference signal can synchronize its own transmission based on such a signal. The RFID does not time the transmission, but merely transmits data as the reference signal is received. This synchronization solution cannot work in BLE transmitters where transmission must occur in specific sessions (or time slots).

Therefore, in order to calibrate BLE transmitter using over-the-air signals, it would be advantageous to provide solutions that can detect signals that can be utilized for such calibration.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" may be used herein to refer to a single embodiment or multiple embodiments of the disclosure.

Some embodiments disclosed herein include an oscillator calibration circuit. The circuit comprises a signal frequency detector for producing a reference signal from a received over-the-air signal detecting a frequency of the over-the-air signal; and a first frequency locking circuit (FLC) coupled to the signal frequency detector and to a first oscillator, wherein the first FLC calibrates the frequency of the first oscillator using the reference signal to a radio frequency (RF) carrier frequency, wherein the reference signal is utilized for calibrating the first oscillator based on the frequency of the detected over-the-air signal.

Some embodiments disclosed herein include a wireless transmitter comprising an antenna; an oscillator calibration circuit coupled to the antenna, wherein the oscillator calibration circuit comprises: a signal frequency detector for producing a reference signal from a received over-the-air signal and detecting a frequency of the over-the-air signal; and a first frequency locking circuit (FLC) coupled to the signal frequency detector and to a first oscillator, wherein the first FLC calibrates the frequency of the first oscillator using the reference signal to a radio frequency (RF) carrier frequency, wherein the reference signal is utilized for calibrating the first oscillator based on the frequency of the detected over-the-air signal.

BRIEF DESCRIPTION OF THE DRAWINGS

The subject matter that is disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
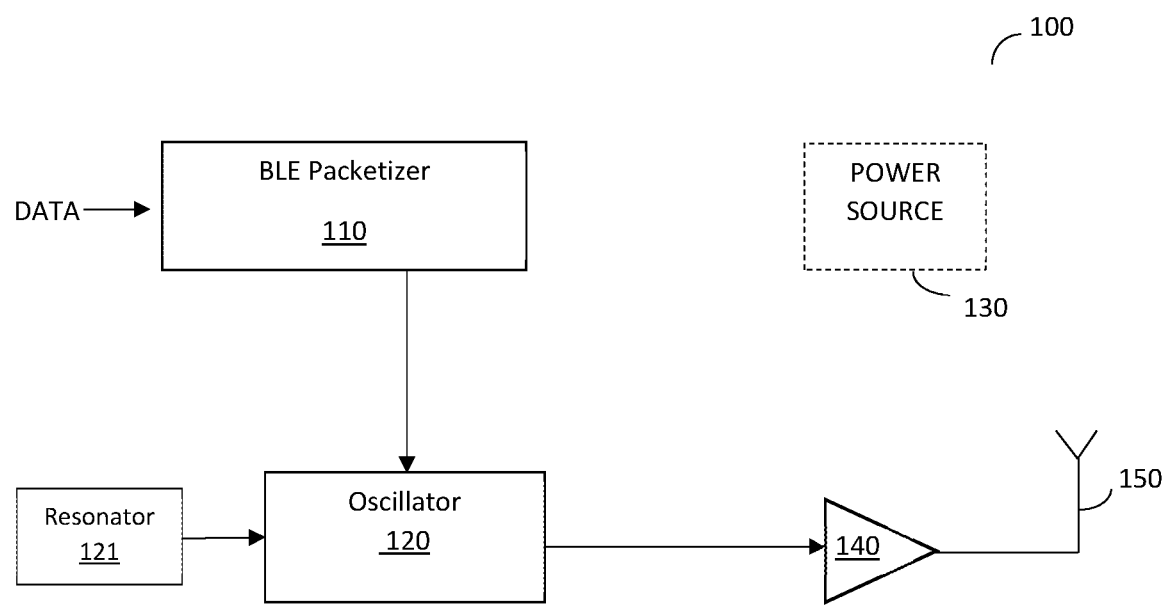
FIG. 1 is a schematic diagram of a conventional BLE transmitter.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Some of the disclosed embodiments include techniques for frequency detection of signals to allow over-the-air (OTA) oscillators calibrating in a BLE transmitter. The oscillator's frequency is locked during a session immediately prior to transmission of data and remains free running during the entire transmit session.

According to some embodiments, the calibration is performed on a local oscillator (typically for the radio frequency carrier wave) and a symbol oscillator. In some configurations, an auxiliary oscillator is also calibrated. The calibration of each of these oscillators include different tracking requirements, so not all of the calibrations are performed before each transmission.

As will be discussed below, the auxiliary calibration is based on OTA signals and multiple measurements needed due to noise averaging and temperature tracking. The local oscillator calibration is based on a reference signal (that may be derived from the OTA signal through the auxiliary oscillator or is the OTA signal). Here multiple calibrations may be required to perform noise averaging, and for tracking environment changes that may influence the local oscillator inductor value (the inductor is actually the antenna which is influenced by the environment).

The calibration of the symbol oscillator is from the local oscillator or OTA signal. Here multiple calibrations are needed to track temperature as well as noise.

Figure 2:
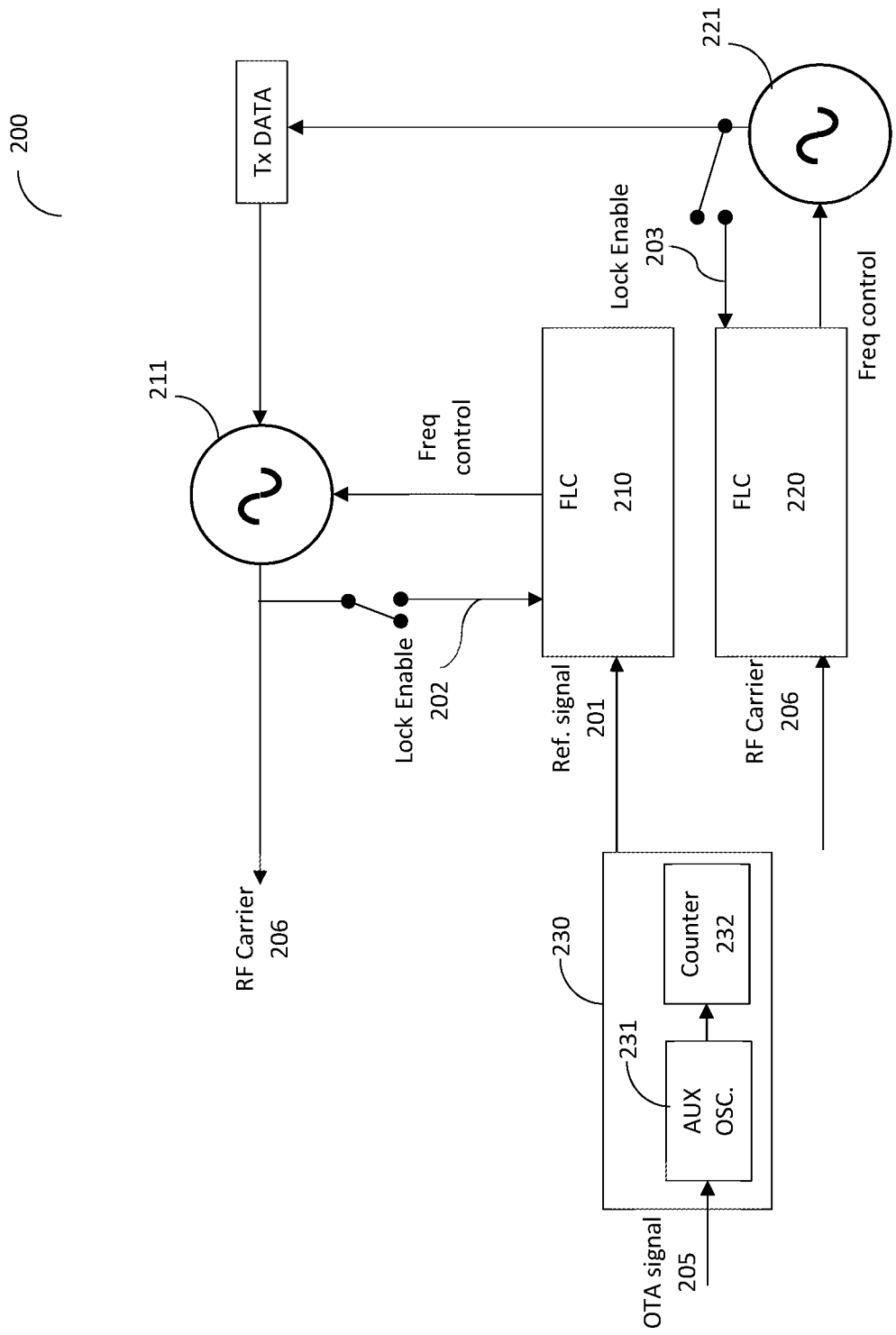
FIG. 2 is a block diagram of an oscillator calibration circuit according to an embodiment.

FIG. 2 shows an example block diagram of an oscillator calibration circuit 200 designed for an OTA signal calibration according to one embodiment. The oscillator calibration circuit 200 includes two frequency locking circuits (FLCs) 210 and 220 for calibrating the frequency of oscillators 211 and 221, respectively. The oscillators 211 and 221 are on-die oscillators, i.e., that are incorporated as part of a BLE transmitter. The oscillators are calibrated using a reference signal 201 derived from an OTA signal 205 using a signal frequency detector (SFD) 230 coupled to the FLC 210. In an embodiment, the OTA signal may serve as the reference signal 201 and the SFD 230 is bypassed. This configuration is applicable when the local oscillator 211 is using an external antenna as an inductor, in which case its frequency may be affected by the OTA signal 205 itself (e.g. by means of frequency pulling or locking effects).

In some embodiments, the oscillator 211 includes an inductor (not shown) that is external to the die, e.g. making use of the external antenna. In such cases, the inductance may be influenced by changes in the environment (e.g. surfaces).

Figure 3A:
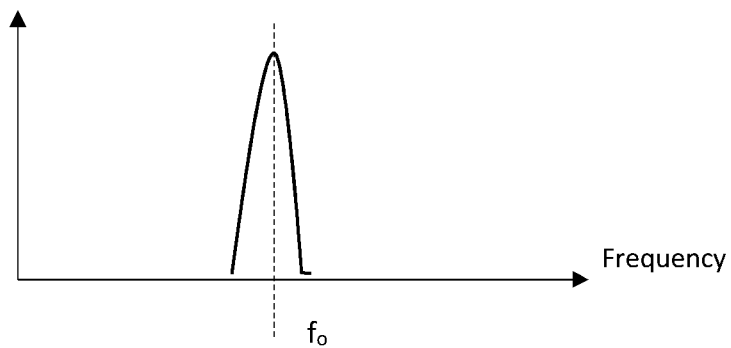
FIGS. 3A, 3B, 3C, and 3D demonstrate the calibration points according to some embodiments.
Figure 3B:
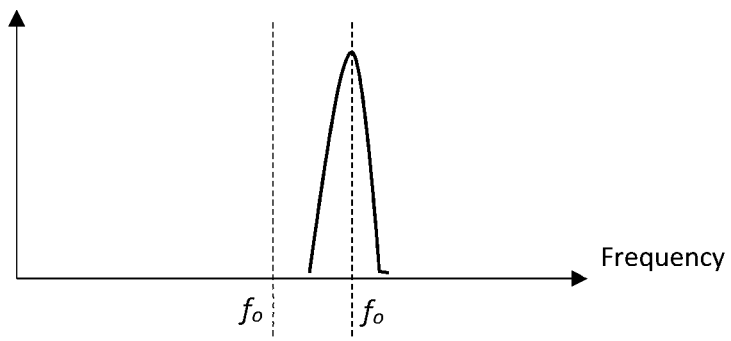
Figure 3C:
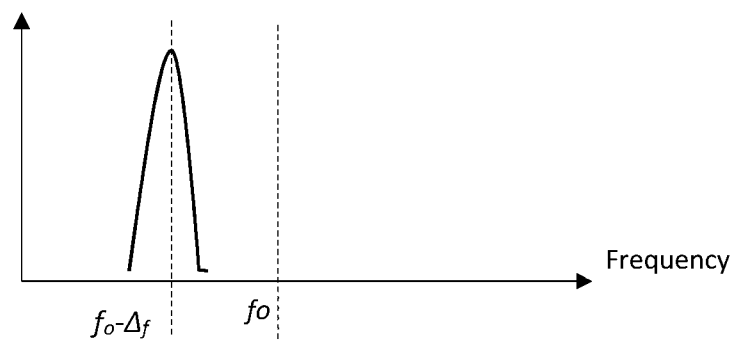
Figure 3D:
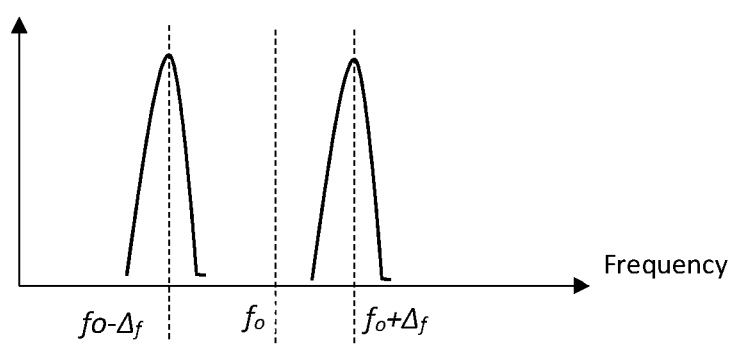

The oscillator 211 can be tuned to different frequencies. In one configuration, demonstrated in FIG. 3A, the oscillator 211 is a local oscillator tuned to a single point carrier frequency. In another configuration, demonstrated in FIG. 3B, the oscillator 211 can be tuned to a (single point) carrier frequency ($f_o$) with a positive offset frequency value of $\Delta f$. In yet another configuration, demonstrated in FIG. 3C, the oscillator 211 can be tuned to a (single point) carrier frequency ($f_o$) with a negative offset frequency value $\Delta f$. In yet another configuration, demonstrated in FIG. 3D, the oscillator 211 can be tuned to two calibration points: a carrier frequency ($f_o$) with a negative offset frequency value $\Delta f$ and a carrier frequency ($f_o$) with a positive offset frequency value $\Delta f$. In the BLE protocol, $\Delta f$ is the frequency deviation utilized to distinguish between binary values of '1' and '0' and is set to about 185 KHz. The carrier frequency ($f_o$) is 2.4 GHz.

In another configuration, the local oscillator 211 can be tuned to an intermediate frequency (IF) frequency signal. For example, the frequency of such a signal would be 24 MHz. The IF signal can be utilized for backscattering the signal on, for example, a BLE backscatter packet.

Returning to FIG. 2, the oscillator 221 is a symbol oscillator configured to generate a symbol signal having a frequency of 1 MHz. The symbol signal is utilized to modulate the data to be transmitted. It should be noted that since for BLE reception the required symbol oscillator 221 accuracy is less than the local oscillator's 211 accuracy (by almost an order of magnitude), typically the symbol oscillator can be tuned less frequently. As such, the calibration of the symbol oscillator 221 is performed by means of the FLC 220 using the RF carrier signal 206. The RF carrier signal can be either the OTA signal 205 or the RF carrier (which is by itself first tuned by FLC 210).

It should be further noted that the calibration of the oscillators 211 and 221 by their respective FLCs 210 and 220 can be performed sequentially (one after the other, in any order) or in parallel. In an example implementation, each of the oscillators 211 and 221 may be realized as a digitally controlled oscillator (DCO).

Each of the FLCs 210 and 220 receives the oscillator signal as feedback, 202 and 203 respectively. The signals may be enabled from a controller (not shown) and configured to enable a frequency lock of the oscillators 211 and 221 prior to transmission sessions. In another embodiment, the feedback signals are enabled upon detection of OTA signals with a predefined frequency (e.g., 2.4 GHz). During transmission sessions, the Lock Enable signals 202 and 203 typically disable the FLCs 210 and 220, hence the frequency locking. The switching between an enabled/disabled state of the FLCs 210 and 220 is performed to reduce power consumption by the FLCs 210 and 220 and to reduce the frequency drift of the oscillators.

Specifically, during transmission sessions when the FLCs 210 and 220 are disabled, these circuits are not powered, reducing the power consumption by the BLE transmitter as the FLCs 210 and 220 are in a free running state. Further, this allows the FLCs 210 and 220 to relock the frequency prior to a transmission session and reduces the frequency drift of the transmitted signal, as the transmission occurs immediately after the oscillators are locked. In an embodiment, a frequency calibration is valid for a period of time, during which there is no need for a new calibration. Calibration and transmission can be performed sequentially, immediately one after the other, or in some embodiments, after calibration, FLC circuits can be powered down, and the device can enter sleep mode, while still storing calibration DCO value in retention memory. In this case, the device will enter active mode and transmit after a certain time interval using the stored DCO value. The time interval should be small enough such that the stored value has not aged. Aging can be caused from temperature changes, that can affect the oscillator circuitry, or from environment changes, which can affect the external inductance. In some embodiments the time interval between calibration and transmission is used to harvest energy for the transmit operation.

In one configuration, the FLCs 210 and 220 are enabled for as long as the FLCs 210 and 220 are calibrated to a target frequency with a tolerance of a predefined frequency error. The frequency accuracy (or timing accuracy) is usually given in parts per million (ppm) of the nominal oscillator frequency. In an embodiment, due to phase noise and other impairments, an actual frequency may not be known. However, the probability of a specific frequency within a certain error can be determined statistically for a given calibration time. Thus, if it is known that a certain receiver can tolerate 200 ppm, a target for success is set, e.g. at 90%. Then, either in simulation or empirically, how much time is needed to calibrate in order to reach the target ppm of 90% probability may be determined. The longer the calibration lasts, the smaller the resulting frequency error is.

The allowed predefined frequency error can be determined based on the allowed error defined in the specification of the BLE protocol. In another configuration, the allowed error is determined based on a tolerance endured by the receiving device. Such a tolerance may be configured in the BLE transmitter or learned over time. For example, for mission critical sensors the allowed frequency error would be smaller than for non-mission critical sensors, as the larger the error, the larger is the packet reception error rate. In yet another configuration, the calibration process performed by each of the FLCs can be timed out after a predefined time window and/or when the available energy is below a predefined threshold.

In some cases, the required accuracy may not be achieved, and small clock changes between the calibration step and data transmission may happen. To overcome that, a "sprinkler span" accuracy process is performed. For example, when the oscillator's 211 frequency accuracy required for good reception is L1=100 kHz. In case the achieved accuracy is L2=1 MHz, where L1 is smaller than L2, the packet is transmitted each packet R=L2/L1 times, each one with a different RF carrier frequency, with L1 frequency spacing between each transmission, such that one of them hits the required frequency target. Thus, the calibration accuracy (and energy budget) can be traded-off with the sprinkler span (which costs latency when R is large). It should be noted that the sprinkler span can be applied when calibrating the oscillator 221 as well.

In one configuration, the required frequency accuracy, i.e., the allowed error, may be different for each of the oscillators 211 and 221. For example, for the oscillator 211 (the local oscillator), the allowed error may be about 100 ppm whereas the frequency accuracy error for the oscillator 221 (symbol oscillator) may be calibrated to an allowed error of 500-1000 ppm.

In an embodiment, the OTA signal 205 may be, any of, a constant-tone, modulated, a BLE beacon, and frequency-hopping signal. For example, an OTA signal 205 may be a BLE advertisement packet signal, an ultra-wideband (UWB) RFID reader signal in the 900 MHz bands, a 13.56 MHz RFID reader signal, a single tone reference at any of the industrial, scientific and medical (ISM) bands, a modulated reference at any of the ISM bands, and an RF signal in the Wi-Fi spectrum (2.4 GHz or 5 GHz bands). The ISM band may be, but is not limited to, the 2.4 GHz band or 433 MHz band.

As noted above, a reference signal 201 is derived from the OTA signal 205 using the SFD 230. The SFD 230 includes an auxiliary oscillator 231 and a counter 232 configured to measure the reference signal 201 from the OTA signal 205.

The measurement of such signal can be represented as:

$$M = \frac{f_{OTA}}{f_{aux}}$$

where, M is measurement, $f_{OTA}$ is the frequency of the OTA signal, and $f_{aux}$ is the frequency of the auxiliary oscillator. The measurement is performed without activation of the FLCs 210 and 220. M is also the frequency of the reference signal 201. The reference signal 201 is later utilized to the calibration of the frequency of oscillator 211. That is, the oscillator 211 can be calibrated to any target frequency. In some embodiments, measurement is done by counting number of zero crosses of the OTA signal during a cycle, or several cycles, of the auxiliary oscillator. This can be performed by using the OTA signal as a clock signal of a counter, while using the auxiliary oscillator as a counter enable for a period of several cycles.

In order to ensure proper calibration, the frequency of the auxiliary oscillator ($f_{aux}$) 231 should remain the same (to some proximity) during the measurement of the reference signal and the calibration of the oscillator 211. The auxiliary oscillator's 231 frequency can change mainly due to phase noise and temperature. As temperature usually changes relatively slow (over time), temperature between the measurement and calibration substantially remains constant when time interval is small enough. However, measurements of the reference signals are refreshed from time to time due to temperature.

To eliminate that effect of the phase noise, multiple OTA measurements can be filtered, e.g., using an alpha filter. The timespan of the filter is smaller than the expected time interval of the temperature change. In an embodiment, multiple measurements are performed and averaged over time. As each measurement can be of a different OTA signal in a different frequency, but still all measurements should be averaged, first a frequency of the OTA signal is detected for each measurement, and then the result is normalized to a single frequency, such that all can be averaged. For example, if a filtered frequency of BLE channel 37 is selected. If during the measurement, a BLE channel 38 is detected, the result is first normalized to BLE channel 37 (multiplied by ratio of frequencies 37/38) before being filtered.

It should be noted that each of the FLCs 210 and 220 can be implemented as a frequency locked loop (FLL), a phased locked loop (PLL), or a delay locked loop (DLL). In an example and non-limiting implementation, an FLL circuit that can be utilized, according to an embodiment, is provided in FIG. 4.

It should be further noted that the oscillator calibration circuit 200 can be integrated in a BLE transmitter, including multiple antennas, each of which can serve a different purpose. For example, one antenna can be dedicated for power harvesting, another antenna to transmit the data, and yet another antenna for the reception of OTA signals. The BLE transmitter can be integrated in any one of: a batteryless IoT device or sensor, that is, a device without a fixed power source.

Figure 4:
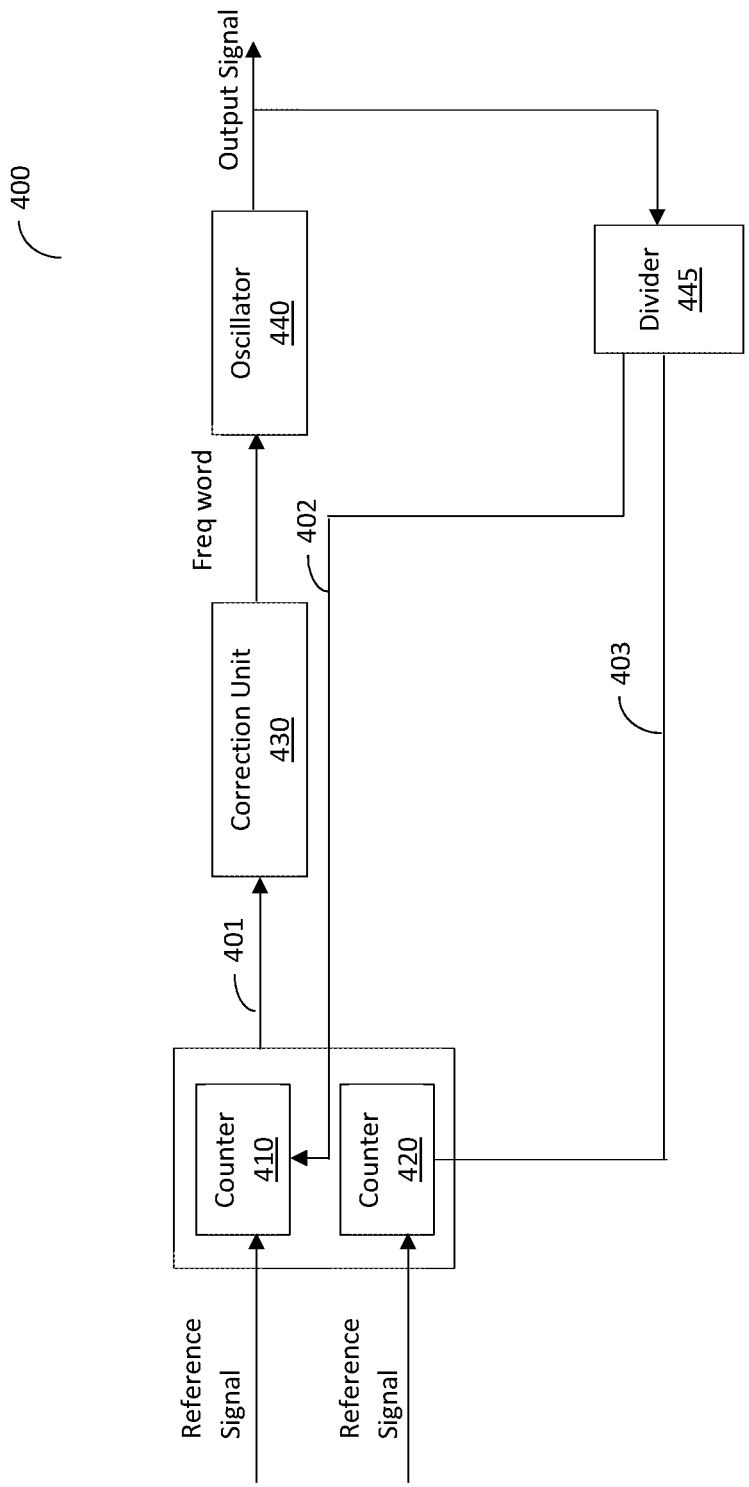
FIG. 4 is a block diagram of a frequency-locked loop (FLL) circuit utilized to describe the disclosed embodiments.

FIG. 4 shows an example block diagram of an FLL circuit 400 that can be utilized in a FLC. The example FLL circuit 400 includes a first counter 410, a second counter 420, and a correction unit 430 which is coupled to an oscillator 440. In this example, the oscillator 440 is a DCO.

The oscillator 440 provides a feedback to the counters 410 and 420, so that the digital frequency word (or byte) sets the oscillator 440 to oscillate in a frequency which is as close as possible to a fraction of the reference signal achieved via the counter (410) (e.g., 2.4 GHz). In this embodiment, the oscillator's 440 output is divided in two by a divider 445 in order to generate two clocks signals (402 and 403) which have different phases. The clock signals serve as the enabled signals for the counters 410 and 420. This enables continuous counting and updating of the digital frequency word. That is, the oscillator 440 is changed until it converges to a target frequency. The oscillator's 440 corrections are performed sequentially, using the counters' 410 and 420 outputs.

The counters 410 and 420 count reference clock cycles within each cycle of the oscillator 440. For example, for a reference continuous wave of 2.4 GHz, 100 cycles are expected for 2400 MHz. Specifically, the first counter 410 counts between positive edges of the enable signal 402 and the second counter 420 counts between negative edges of the enable signal 403. At the positive edge of the enabled signal 402, the counter 410 is preset to the target calibration value and counts during a full clock cycle. If the preset is positive, the counter counts down. If it is negative, it counts up. The counter's 410 value at the end of each clock cycle is proportional to the frequency offset between the oscillator 440 and the reference signal 401. A negative value means the oscillator 440 is faster than the reference signal, and a positive value means the oscillator 440 is slower than the reference signal, e.g., when the preset is negative, and the counter is counting up. At the negative edge of the oscillator 440, the counter value is latched into the correction unit 430.

The second counter 420 is similarly driven by the enable signal 403, so while the value of the first counter 410 is latched and propagated through the correction unit 430, the second counter 420 counts over the next full oscillator's 440 clock cycle to generate its count value. Thus, counters 410 and 420 operate alternately on clock cycles of the oscillator 440.

The correction unit 430 receives the count values which represent the frequency offset between the oscillator 440 and the reference signal 401. In an example configuration, the count values are multiplied by K (an integer value which is the power of 2) in order to translate the detector output to equivalent frequency units (Hertz). The correction unit 430 also averages the error to achieve a more accurate estimation. The output of the correction unit 430 is a digital frequency word having a predefined number of least significant bit (LSBs) that are not passed to the oscillator 440.

In one configuration, the correction unit 430 can be realized as a wired logic gate, a microcontroller, a microprocessor, and the like. As noted above, the frequency locking is performed before the data transmission session. In an embodiment, at each frequency locking session the oscillator 440 can be set to a previous digital frequency word used to set the oscillator 440 in a previous locking session. In yet another embodiment, the correction unit 430 should be realized in software, firmware, middleware, or any combination thereof.

In one embodiment, when the FLL circuit 400 is implemented in a transmitter operating in wave computing cycles, the calibration can be performed in waves (or phases). In this embodiment, the calibration is broken down into waves. Each wave performs a limited number of calibration steps (i.e., one or more steps). The state of the FLL circuit 400 is saved in a retention memory until the next wave.

Figure 5:
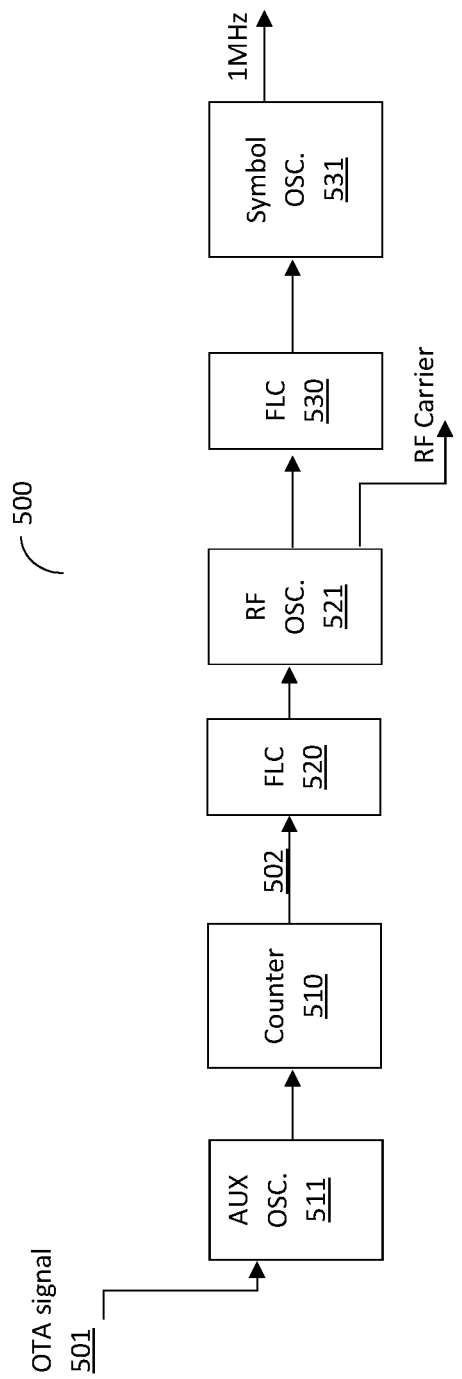
FIG. 5 is a block diagram of an oscillator calibration circuit designed according to another embodiment.

FIG. 5 shows an example oscillator calibration circuit 500 designed for an OTA reference signal calibration. In this example embodiment, the oscillator calibration circuit 500 includes FLCs 520, and 530 respectively calibrating oscillators 521, and 531. In this configuration, the calibration of oscillators 521 and 531 is performed sequentially. The oscillator calibration circuit 500 also includes a counter 510 for measuring a frequency of the auxiliary oscillator 511.

One reason for the sequential calibration is that in certain configurations, the local oscillator cannot be calibrated when the 2.4 GHz reference signal is received over the air. Hence, first an auxiliary oscillator is used, having a different frequency than the reference signal. Before a local oscillator calibration, it should be determined that the reference signal is no longer OTA. In scenarios where the reference signal is known to have a specific time span (e.g., a signal from a BLE beacon), it is sufficient to wait for the specific time space between auxiliary calibration and local oscillator calibration.

In an embodiment, a frequency of the auxiliary oscillator 511 is measured using an OTA signal 501 by means of the counter 510. The signal 501 may be any type of the OTA signals mentioned above. The auxiliary oscillator's 511 is measured to output a reference signal 502, where its frequency is measured relative to the OTA signal. This is used to set the preset value of the subsequent local oscillator calibration.

The reference signal 502 serves as a reference frequency to the FLC 520 which calibrates a local oscillator 521. According to one embodiment, the local oscillator 521 can be calibrated to output a single point carrier frequency or two points carrier frequencies as discussed with reference to FIGS. 3A-3D. Here, the output of the local oscillator 521 serves as a carrier signal for the BLE transmitter and as a reference signal for the FLC 530. The FLC 530 calibrates a symbol oscillator 531 to output a symbol signal having a frequency of 1 MHz. The symbol signal is utilized to modulate the data to be transmitted.

Each of the FLCs 520, and 530 can modulate the signal as discussed in detail above with reference to FIGS. 2 and 4. In this embodiment, the calibration is performed prior to a transmission session, while during transmission all FLCs are disabled and the oscillators are free running.

It should be appreciated that the oscillator calibration circuit 500 demonstrates high frequency accuracy and low power consumption. This is because the local oscillator 521 and symbol oscillator 531 are calibrated using a low phase noise and previously calibrated (auxiliary) reference signal. As such, the calibration time is short, which results in less power consumption.

The utilization of the auxiliary oscillator allows for overcoming frequency pulling. This phenomenon occurs when a local oscillator's LC circuit is designed using an external antenna as in inductor. Frequency pulling typically changes the oscillating frequency. By adding an additional calibration stage, through the auxiliary oscillator, the reception of the reference signal is decoupled from the transmission of the carrier signal.

It should be noted that the oscillator calibration circuit 500 can be configured in other arrangements. For example, the counter 510 could be utilized for calibration of both FLCs 520 and 530.

It should be further noted that the oscillator calibration circuits 500 and 200, designed according to the disclosed embodiments, do not include any explicit resonator component, such as a crystal resonator, a quartz resonator, or a MEMS-based resonator.

Figure 6:
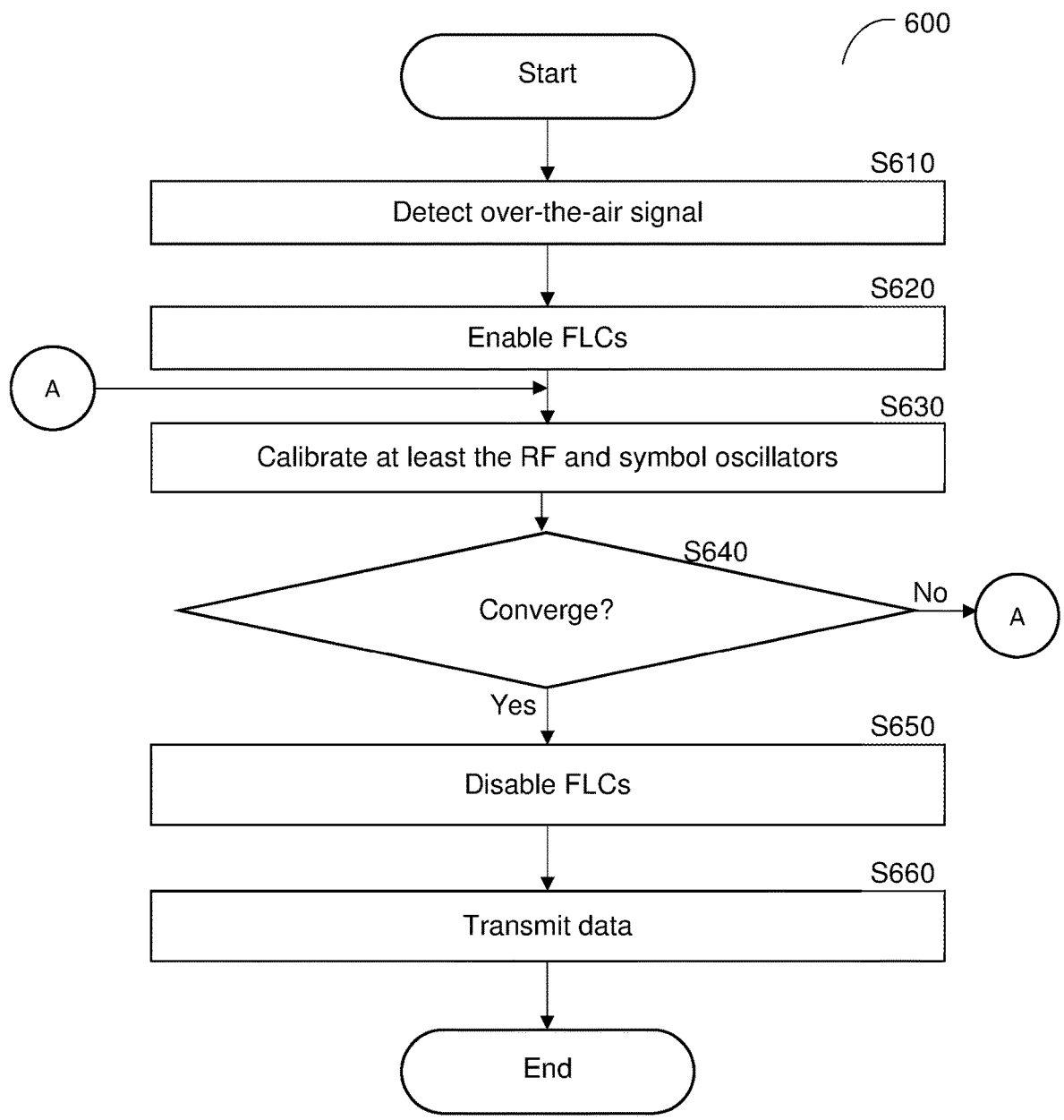
FIG. 6 is a flowchart of a method for calibrating an oscillator using over-the-air-signals according to an embodiment.

FIG. 6 shows an example flowchart 600 for calibrating a local oscillator using OTA signals according to an embodiment. The oscillator is operable in a wireless transmitter, such as, but not limited to, a BLE transmitter.

At S610, an OTA signal received over the air is detected. In an embodiment, a detection event is triggered when a signal having a specific frequency is received. In another embodiment, a detection event is triggered when a packet is received over a specific channel of one of the BLE channels. In another embodiment, a detection event is triggered when the energy level of a received signal exceeds a predefined energy. Embodiments for detecting the OTA signals are discussed in more detail in FIGS. 7 and 8. The detection of an OTA signal is resulted in a reference signal utilized to calibrate the local oscillator.

At S620, once an OTA signal is detected, lock enable 202, 203 signals are triggered to enable FLCs for calibrating the RF and symbols oscillator. It should be noted that when an auxiliary oscillator is utilized, an FLC calibration coupled to such oscillator is enabled as well.

In an embodiment, all FLCs are activated at the same time to allow concurrent calibration of the oscillators. In another embodiment, the FLCs are sequentially calibrated. For example, the FLC calibrating the auxiliary oscillator is enabled, once the auxiliary oscillator is locked, and then the FLC calibrating the local oscillator is enabled. Finally, once the oscillator auxiliary is locked, the FLC calibrating the symbol oscillator is enabled.

At S630, at least one of the local and symbol oscillators are calibrated to their target respective frequencies. At S640, it is checked if the RF and symbol oscillators have converged or are otherwise locked on the target of their respective frequencies. If so, at S650, the FLCs are disabled; otherwise, execution returns to S630. It should be noted that the calibration process is terminated if the oscillators are not converged after a predefined time interval or after the power consumption reaches a certain level. At S660, the data modulated using the symbol signal is transmitted over a carrier signal generated by the local oscillator.

The calibration processes disclosed herein can operate with standard (off-the-shelf) devices transmitting BLE signals or controlled devices. The standard devices transmit on 3 advertising channels 37, 38, 39. The controlled devices transmit BLE or continuous wave (CW) signals in any channel in the 2.4 GHz spectrum. These signals can be used as an OTA signal for calibration and/or measurement.

Figure 7:
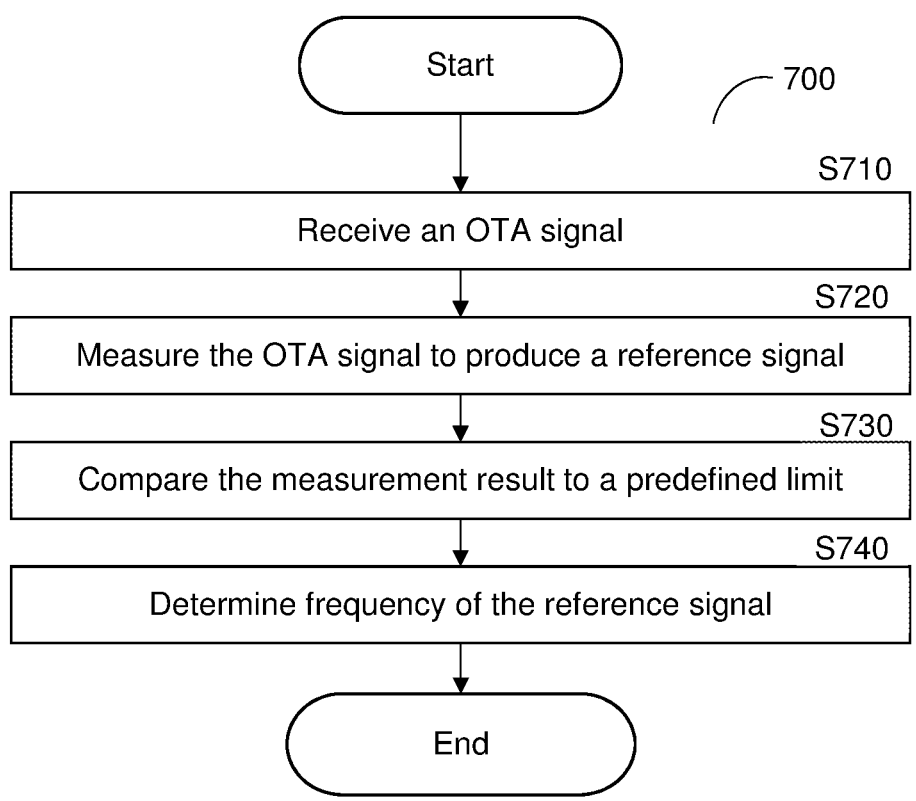
FIG. 7 is a flowchart for detecting over-the-air signals utilized for calibrating oscillator clocks based on over-the-air reference signals according to an embodiment.

FIG. 7 is an example flowchart 700 of a method for detecting OTA signals utilized for calibrating oscillators according to one embodiment. Here the detection is based on OTA signals received from one source and having a single frequency. To accurately calibrate oscillators, in a wireless transmitter, using OTA signals, the frequency of such signals should be determined. As the wireless spectrum includes many signals at different frequencies, the detection attempts to determine the frequency of the received signals to be utilized for the calibration. Typically, in an example embodiment, for BLE transmitters, BLE advertising channels, namely one of channels 37, 38, or 39 serve for the calibration. It is further required to determine the channel of such signal for accurate calibration.

The method discussed with reference to FIG. 7 is based on "side information" which requires only a single trigger and wakeup on the OTA signal. The side information is about a frequency of an auxiliary oscillator that together with a counter measures a reference signal from the OTA signal. The side information should be accurate up to a certain threshold. For example, to distinguish between channels 37 (2042 MHz) and 38 (2426 MHz), 24 MHz apart, the accuracy should be within 12 MHz (half the distance between the channels) which is equivalent to ~5000 ppm. The side information can be obtained from prior-calibration of the auxiliary oscillator.

At S710, an OTA signal is received. The OTA signal may trigger a wake-up radio (WUR) of an IoT device. In an embodiment, the OTA signal is a signal propagated over a BLE advertising channel, namely one of channels 37, 38, or 39. However, it may not be known which of these channels the OTA signal is propagating over.

At S720, the OTA signal is measured using the auxiliary oscillator and a counter to produce a reference signal. As noted above, the auxiliary oscillator and the counter are part of the reference signal generator (RSG). The reference signal is utilized for the calibration of the local and/or symbol oscillators.

As the reception channel is not deterministic, the OTA signal is monitored over a time interval that would ensure that the measurement reaches a predefined accuracy (e.g., less than 500 ppm). Because the reference signal is measured and not calibrated, there is no assumption on the frequency of such measurements. Rather, each resulting measurement is analyzed to determine which of the three frequencies (i.e., channels 37, 38, or 39) the reference signal is closer to, according to the side information on the reference signal.

At S730, the measurement result (reference signal's frequency) is compared to predetermined upper and lower limits. The limits relate to the frequencies of the BLE advertising channels.

At S740, the frequency (or channel) of the reference signal is determined based on the comparison. Specifically, when the reference signal's frequency, is above an upper limit, it is determined that the channel of the OTA signal (from which the reference signal is derived) is one channel down relative to the predefined monitoring channel (e.g., channel 37 if the initial channel is 38). When the reference signal's frequency is below a lower limit, is it determined that the channel of the OTA signal (from which the reference signal is derived) is one channel up relative the predefined monitoring channel (e.g., channel 39). When the reference signal lies between the upper and lower limits, it is determined that the channel of the OTA signal (from which the reference signal is derived) lies in the monitoring channel (e.g., channel 38). The measurement continues until a target predefined accuracy is reached. It should be noted that the output of S740 may a digital frequency word that can be saved in a memory.

In an embodiment, the determination of lower and upper limits are typically performed during production calibration. In one embodiment, the frequency is measured in room temperature. It is then known by characterization how much the frequency change as a function of temperature. For example, if the product should be functional within e.g. +−20 degrees of room temperature, the upper limit can the anticipated frequency of room −20 deg (typically the frequency drops with increase of temperature), and the lower limit can be the anticipated frequency of room+20 deg.

The determined channel provides the frequency of the reference signal which is used to calibrate the local oscillator and/or symbol oscillators of the BLE transmitter. The calibration of such oscillators are discussed in greater detail above.

Figure 8:
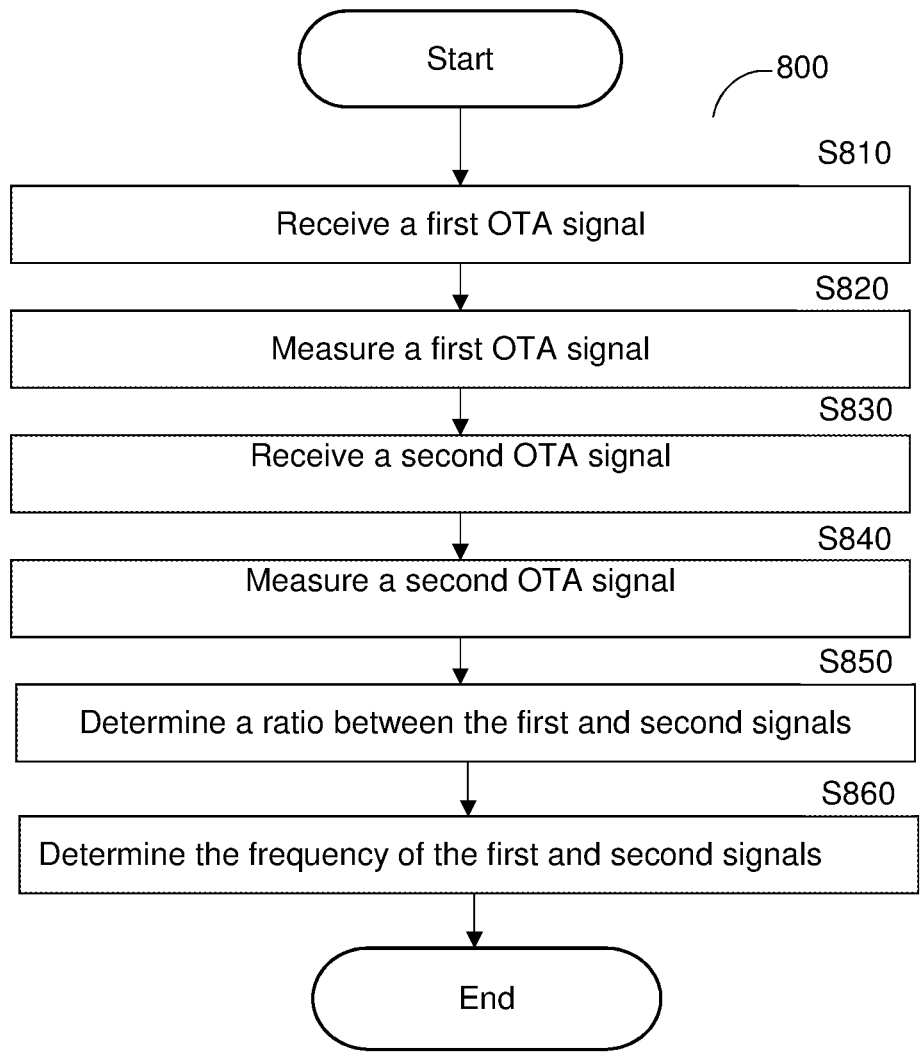
FIG. 8 is a flowchart for detecting over-the-air signals utilized for calibrating oscillator clocks based on at least two reference over-the-air signals according an embodiment.

FIG. 8 is an example flowchart 800 of a method for detecting OTA signals utilized for calibrating oscillators according to another embodiment. Here the detection is based on OTA signals may be received from one or more sources, but having two different frequencies.

At S810, a first OTA signal is received. At S820, the first OTA signal is measured to produce a first reference signal. Such measurement is performed using the auxiliary oscillator and counter. The first OTA signal lies within a predefined BLE advertising channel "the first channel" (e.g., channel 37). The reference signal is "output" when a predefined accuracy is reached at a target probability. The frequency (e.g., a digital frequency word representing the same) of the first reference signal is saved in a memory (not shown).

At S830, a second OTA signal is received. At S840, the second OTA signal is measured to produce the second reference signal. The second OTA signal may be within one channel up or down relative to the first channel ("the second channel", e.g., channel 38). The second reference signal is "output" when a predefined accuracy is reached at a target probability. The frequency (e.g., a digital frequency word representing the same) of the second reference signal is saved.

At S850, a ratio between the first and second reference signals is determined. At S860, the frequency of first and second OTA signals (and hence the reference signals) are determined based on the ratio. In an embodiment, the determination is based on the fact that the six ratios of advertising channels 37/38, 37/39, 38/37, 39/37, 38/39, 39/38 are known and unique. If the measured ratio matches one of the known 6 ratios, the two channels can be determined. If the ratio is approximately 1, then it can be assumed that the two measurements happened in the same frequency, and frequency is not known (37/37=38/38=39/39=1).

Further, when the first OTA signal is assumed to be either on channel 37 or 38, and compared with second OTA signal. When the second OTA signal is determined to be on the second channel (as originally assumed), the reference signal can be utilized for the calibration of the local oscillator. When the second OTA signal is determined to be either on the first channel or third channel, a new calibration, using the correct frequency, is started to achieve the target accuracy. When the determined ratio is 1 or substantially equal to 1, then the second OTA signal is on the same channel as the first OTA signal. In such case, the reference signals cannot be utilized for the calibration of the local and/or symbol oscillator. In this case, the operation is aborted, and resumes after a subsequent WU event.

It should be noted that as the difference between channels 37 and 38 is around 1%, the short calibration for frequency detection may be set with an accuracy target of less than 0.5%. This should be sufficient to differentiate between the channels.

In some embodiment, the detection methods discussed with reference to FIGS. 7 and 8 can perform in tandem. In an embodiment, at bootstrap of the transmitter or initial frequency measurement, first the detection based on at least two sources (as discussed with reference to FIG. 8) is performed. Then, the detected frequency is used a side information for the auxiliary oscillator and frequency detection is performed using this information (as discussed with reference to FIG. 7). Further, the detection methods discussed with reference to FIGS. 7 and 8 can be performed in combination. In this case, a channel can be declared as detected only if both methods agree on the same frequency. Otherwise, measurement can be ignored.

It should be noted that the methods discussed above with reference to FIGS. 7 and 8 can be viewed as calibrating the auxiliary oscillator which is used to measure a frequency of the reference signal.

It should be noted that in order to allow accurate calibration of the local and symbol oscillators, the auxiliary oscillator should be periodically tracked. This is because the frequency of the auxiliary oscillator may be changed overtime (e.g. due to temperature). Further, as described above, multiple measurements are needed for averaging of the reference signals.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise a set of elements comprises one or more elements. In addition, terminology of the form "at least one of A, B, or C" or "one or more of A, B, or C" or "at least one of the group consisting of A, B, and C" or "at least one of A, B, and C" used in the description or the claims means "A or B or C or any combination of these elements." For example, this terminology may include A, or B, or C, or A and B, or A and C, or A and B and C, or 2A, or 2B, or 2C, and so on.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. An oscillator calibration circuit, comprising:
a signal frequency detector for producing a reference signal from a received over-the-air signal detecting a frequency of the over-the-air signal; and
a first frequency locking circuit (FLC) coupled to the signal frequency detector and to a first oscillator, wherein the first FLC calibrates the frequency of the first oscillator using the reference signal of a radio frequency (RF) carrier frequency, wherein the reference signal is utilized for calibrating the first oscillator based on the frequency of the detected over-the-air signal.

2. The oscillator calibration circuit of claim 1, wherein the signal frequency detector further comprises:
an auxiliary oscillator; and
a counter coupled to the auxiliary oscillator, wherein the counter measures a frequency of the auxiliary oscillator relative to the over-the-air signal.

3. The oscillator calibration circuit of claim 1, wherein the signal frequency detector is further configured to:
compare the frequency measurement to a predefined lower limit and upper limit; and
determine the frequency of the over-the-air signal based on the comparison.

4. The oscillator calibration circuit of claim 3, wherein the detected frequency of the over-the-air signal is determined relative to a frequency of a Bluetooth low energy (BLE) advertising channel, and wherein the upper limit and the lower limit are relative to at least an upper BLE advertising channel a lower BLE advertising channel, respectively.

5. The oscillator calibration circuit of claim 1, wherein the signal frequency detector is further configured to detect the frequency based on at least two over-the-air signals, wherein the two over-the-air signals are of different frequencies.

6. The oscillator calibration circuit of claim 5, wherein the signal frequency detector is further configured to:
receive a first over-the-air signal;
detect a frequency of the first over-the-air signal produced from the first over-the-air signal;
receive a second over-the-air signal;
detect a frequency of the second over-the-air signal produced from the first over-the-air signal;
determine a ratio between the frequency of the first reference signal and the frequency of the second reference signal; and
based on the ratio, determine the frequencies of the first and second reference signals and the first and second over-the-air signals.

7. The oscillator calibration circuit of claim 6, wherein the calibration of the first oscillator is aborted when the determined ratio is substantially equal to 1.

8. The oscillator calibration circuit of claim 6, wherein the ratio determines the frequencies relative to BLE advertising channels.

9. The oscillator calibration circuit of claim 1, further comprising:
a second FLC coupled to a second oscillator, wherein the second FLC calibrates the frequency of the second oscillator using the RF carrier frequency, wherein the second oscillator is a symbol oscillator being calibrated to a modulation frequency.

10. The oscillator calibration circuit of claim 9, further comprising: transmitting a data packet multiple times, wherein each packet is transmitted with a delta-frequency relative to a previous packet, wherein the total frequency span to transmit the data packet is determined based on a ratio between a target accuracy and an achieved accuracy when calibrating the first oscillator, wherein the data packet sent in a center frequency is transmitted over the RF carrier frequency.

11. The oscillator calibration circuit of claim 1, wherein the over-the-air signal is derived from any one of: a constant-tone signal, a modulated signal, a BLE beacon, and a frequency-hopping signal.

12. The oscillator calibration circuit of claim 1, wherein the over-the-air signal is received through an antenna utilized for data transmission.

13. The oscillator calibration circuit of claim 1, wherein the oscillator calibration circuit is operable in at least a BLE transmitter.

14. The oscillator calibration circuit of claim 13, wherein the BLE transmitter is integrated in any one of: a battery-less wireless sensor or a battery-less wireless device.

15. The oscillator calibration circuit of claim 1, wherein the oscillator calibration circuit does not utilize an explicit resonator component to calibrate any of the first oscillator and a second oscillator, and wherein the explicit resonator component, is any one of a crystal resonator, a quartz resonator, or a MEMS-based resonator.

16. A wireless transmitter, comprising:
an antenna;
an oscillator calibration circuit coupled to the antenna, wherein the oscillator calibration circuit comprises:
a signal frequency detector for producing a reference signal from a received over-the-air signal and detecting a frequency of the over-the-air signal; and
a first frequency locking circuit (FLC) coupled to the signal frequency detector and to a first oscillator, wherein the first FLC calibrates the frequency of the first oscillator using the reference signal to a radio frequency (RF) carrier frequency, wherein the reference signal is utilized for calibrating the first oscillator based on the frequency of the detected over-the-air signal.

17. The wireless transmitter of claim 16, wherein the signal frequency detector further comprises:
an auxiliary oscillator; and
a counter coupled to the auxiliary oscillator, wherein the counter is configured to measure a frequency of the auxiliary oscillator relative to the over-the-air signal.

18. The wireless transmitter of claim 16, wherein the wireless transmitter is a BLE transmitter integrated in any one of: a battery-less wireless sensor or a battery-less wireless device.

19. The wireless transmitter of claim 16, further comprising:
a second FLC coupled to a second oscillator, wherein the second FLC calibrates the frequency of the second oscillator using the RF carrier frequency, wherein the second oscillator is a symbol oscillator being calibrated to a modulation frequency.

20. The wireless transmitter of claim 19, wherein the wireless transmitter is configured to:
transmit a data packet multiple times, wherein each packet is transmitted with a delta-frequency relative to a previous packet, wherein the total frequency span to transmit the data packet is determined based on a ratio between a target accuracy and an achieved accuracy when calibrating the first oscillator, wherein the data packet sent in a center frequency is transmitted over the RF carrier frequency.

* * * * *